(12) United States Patent
Tannous et al.

(10) Patent No.: US 6,249,990 B1
(45) Date of Patent: *Jun. 26, 2001

(54) METHOD AND APPARATUS FOR TRANSPORTING ARTICLES

(75) Inventors: Adel George Tannous, Santa Clara; Jeffrey Miller, Los Gatos; Khalid Makhamreh, Santa Clara, all of CA (US)

(73) Assignee: AlliedSignal, Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 41 days.

(21) Appl. No.: 09/275,359

(22) Filed: Mar. 23, 1999

(51) Int. Cl.[7] ........................................ F26B 5/04
(52) U.S. Cl. ............................... 34/402; 34/410; 34/417; 34/467; 34/72; 34/210; 438/14
(58) Field of Search .............................. 34/380, 381, 402, 34/410, 417, 426, 443, 467, 527, 548, 72, 201, 202, 209, 210, 242; 414/411, 416, 937; 438/14, 16, 17

(56) References Cited

U.S. PATENT DOCUMENTS

| 4,850,380 | * | 7/1989 | Koslow | 134/56 R |
| 5,370,491 | * | 12/1994 | Bonora et al. | 414/217 |
| 5,482,161 | * | 1/1996 | Williams et al. | 414/217 X |
| 5,829,939 | * | 11/1998 | Iwai et al. | 414/411 |
| 5,848,933 | * | 12/1998 | Roberson, Jr. et al. | 454/187 |
| 5,902,088 | * | 5/1999 | Fairbairn et al. | 414/217 |
| 5,950,817 | | 9/1999 | Iwamoto et al. | 206/204 |

FOREIGN PATENT DOCUMENTS

| 10211938 | 11/1998 | (EP) | B65D/25/10 |
| 05326679 | 10/1993 | (JP) | H01L/21/68 |
| 06318631 | 11/1994 | (JP) | H01L/21/68 |

* cited by examiner

Primary Examiner—Stephen Gravini (57) ABSTRACT

In one embodiment, a cart (5) having a first vessel (10) which fits within a second vessel (90) is used to transport and store an integrated circuit substrate. The integrated circuit substrate is placed within the first vessel (10) and the door (18) of the first vessel (10) is closed and sealed against a door seal (24). The first vessel (10) is then purged with nitrogen to expel moisture and reactive gases from the interior of the first vessel (10). After purging, the first vessel (10) is then placed within the second vessel (90). The door (102) of the second vessel (90) is then closed and sealed against a door seal (104). The second vessel (90) is then purged with nitrogen to expel moisture and reactive gases from the interior of the second vessel (90). The cart (5) containing the integrated circuit substrate is then transported to the next manufacturing area. Integrated circuits and other articles may be manufacturing using the cart system of the present invention.

48 Claims, 8 Drawing Sheets

METHOD AND APPARATUS FOR TRANSPORTING ARTICLES

FIELD OF THE INVENTION

The present invention relates to a method and an apparatus for transporting and storing articles in a manufacturing environment, and more specifically to a method and an apparatus for transporting and storing articles, such as integrated circuit substrates, flat panel diplays, substrates for disk drives, or packaged integrated circuits which are vulnerable to contamination or electro-static discharges.

BACKGROUND OF THE INVENTION

In a manufacturing environment, it is often necessary to transport articles of manufacture from one processing area to another. During transportation, some articles are particularly sensitive to contamination and electro-static discharges, and thus these articles are often damaged.

For example, a particle deposited on an integrated circuit substrate can compromise the integrity of its integrated circuits. In addition, exposure of the integrated circuit substrate to moisture can cause its aluminum lines to corrode, or its photoresist patterns to swell or delaminate, while exposure to oxygen can cause unwanted oxidation of its exposed surfaces. Furthermore, an electro-static discharge involving the integrated circuit substrate can render its integrated circuits inoperable. Similarly, the integrity of carbon coated disk drive media can be compromised by unwanted exposure to oxygen, which can cause the carbon coating to become oxidized, while the integrity of packaged integrated circuits can be compromised by moisture, which can cause package cracking.

One proposed method for protecting these sensitive articles during transportation is to place the articles within a first plastic bag and then to place the first plastic bag within a second plastic bag. The plastic bags, however, are often penetrated by gaseous contaminates from the external ambient, and thus the articles are contaminated. In addition, during the double bagging process itself, gaseous contaminates are trapped within the bags and the articles are contaminated. Furthermore, the plastic bags themselves often outgas contaminants and contaminate the articles.

Another proposed method is to place the articles within a first portable container, and then to pressurize the first portable container with nitrogen. As a safety precaution, the first portable container may be fitted with a pressure relief valve so that it is not accidentally over-pressurized. The first portable container may then placed within a second portable container, and the second portable container subsequently pressurized with nitrogen. As a safety precaution, the second portable container also may be fitted with a pressure relief valve so that it is not accidentally over-pressurized. The articles may then transported to their next destination via the first and second portable containers. During transportation a nitrogen cylinder mounted to the second portable container may be used to ensure that a positive pressure is maintained within the second portable container. The positive nitrogen pressure within the first container and the second container may inhibit penetration of the containers by gaseous contaminates from the external ambient. Such a double container process, however, does not fully prevent gaseous contaminates from being trapped within the containers, and thus allows the articles to be contaminated. In addition, the portable containers are often metal, and ungrounded. Therefore, articles placed within the containers are often damaged by electro-static discharges, which occur between the articles and the metal container.

Accordingly, a need exists for an efficient way to transport and store sensitive articles, while at the same time minimizing damage due to contamination or electro-static discharges.

DETAILED DESCRIPTION OF THE DRAWINGS

The present invention provides a method and an apparatus for transporting and storing articles, wherein damage to the articles, due to contamination or electro-static discharge, is minimized, and methods for manufacturing articles based on such a method and apparatus. In one embodiment, the cart is used to transport and store integrated circuit substrates. In alternative embodiments, the cart is used to transport and store other articles, such as flat panel diplays, substrates for disk drives, or packaged integrated circuits which are vulnerable to contamination or electrostatic discharges as part of a manufacturing process.

Figure 1:
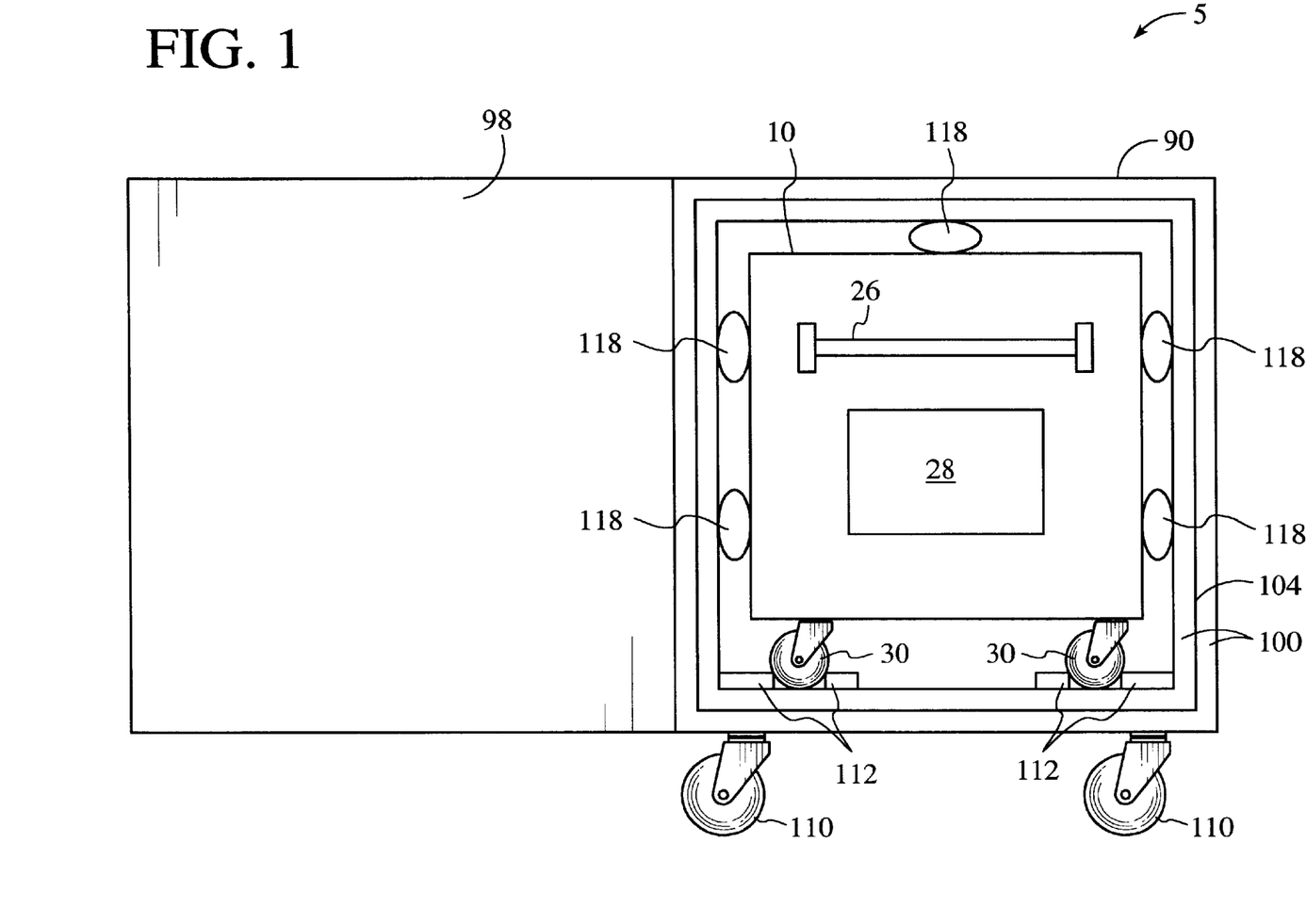
FIG. 1 illustrates a cart, which is in accordance with one embodiment of the present invention.

Shown in FIG. 1 is a cart 5 for transporting and storing articles in accordance with one embodiment of the present invention. Cart 5 comprises a first vessel 10 which fits within a second vessel 90. Articles to be transported are placed within first vessel 10, and then first vessel 10 is purged with an inert gas to remove contaminates from the interior of first vessel 10. After purging, the first vessel 10 is placed within second vessel 90. Second vessel 90 is then purged with an inert gas to remove contaminates from the interior of second vessel 90. The articles are then transported to a selected manufacturing area via cart 5. Cart 5 protects the articles from being contaminated by particulates, moisture, or reactive gases, such as oxygen. In addition, cart 5 also provides electro-static discharge (ESD) protection for the articles.

Figure 2:
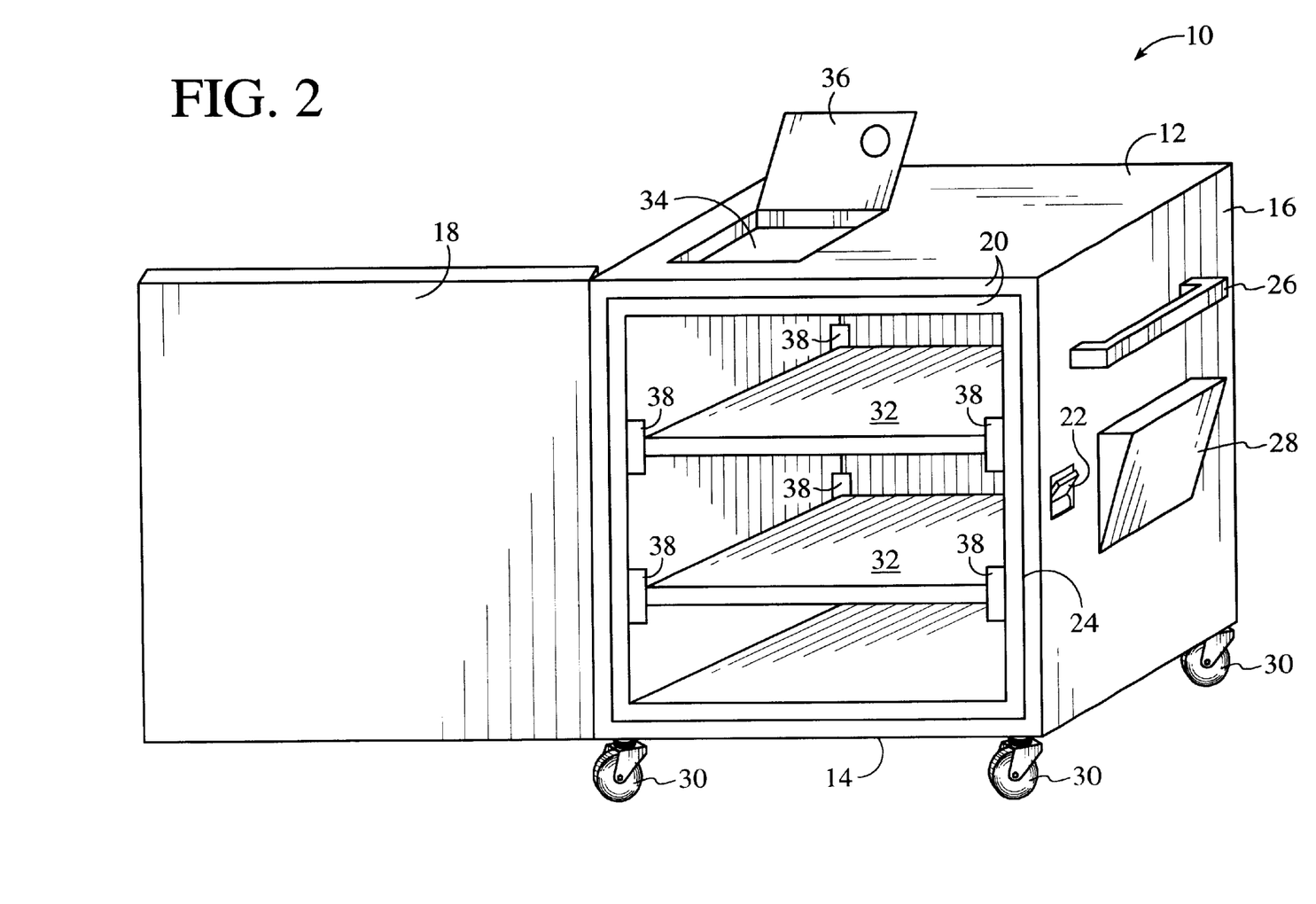
FIG. 2 illustrates an internal vessel, which is in accordance with one embodiment of the present invention.

Shown in FIG. 2 is a first vessel 10 in accordance with one embodiment of the present invention. In this particular embodiment first vessel 10 comprises a top 12, a bottom 14, sides 16, a door 18, a door frame 20, a door latch 22, a door seal 24, a push handle 26, a document holder 28, wheels 30, shelves 32, and an ambient control system 34. Ambient control system 34 lies within a recess formed within a portion of top 12 and is accessed through access door 36.

Door seal 24 is attached to door frame 20 and is used to form a seal between door 18 and door frame 20. Door latch 22 retains door 18 against door seal 24 when forming the seal between door 18 and door frame 20. In one embodiment, door seal 24 is a gasket made of a halogenated elastomer, such as Viton. Alternatively, door seal 24 may be formed using other materials which are also capable of forming a seal between door 18 and door frame 20, such as a cellular urethane material like Poron. Push handle 26 is mounted on one side 16 of first vessel 10, and it is used to maneuver first vessel 10. In an alternative embodiment, first vessel 10 also comprises a second push handle (not shown), which is mounted to first vessel 10 such that it opposes push handle 26. Document holder 28 is mounted to one side 16 of first vessel 10, and it stores documents accompanying the articles that are placed within first vessel 10. In this particular embodiment, shelves 32 are electrically isolated from sides 16 by insulating mounts 38 so that electro-static charging of shelves 30 is minimized. In one embodiment, insulating mounts 38 are made of ultra high molecular weight polyethylene. Alternatively, insulating mounts 38 may be formed using other dielectric materials. Shelves 32 may be adjustably placed to accommodate different sizes and shapes, and may be placed either horizontally or vertically within first vessel 10. Shelves 32 may be formed using perforated plates, wire-type grids, or a combination thereof in order to facilitate the flow of gas within first vessel 10 during purging. In alternative embodiments, shelves 32 may also be formed using non-perforated plates. In one embodiment, top 12, bottom 14, sides 16, door 18, door frame 20, door latch 22, push handle 26, document holder 28, and shelves 32 are formed of aluminum in order to minimize the weight of first vessel 10. In alternative embodiments, top 12, bottom 14, sides 16, door 18, door frame 20, door latch 22, push handle 26, document holder 28, and shelves 32 are formed using other materials, such as stainless steel, or a mixture of materials, such as aluminum and stainless steel.

Figure 3:
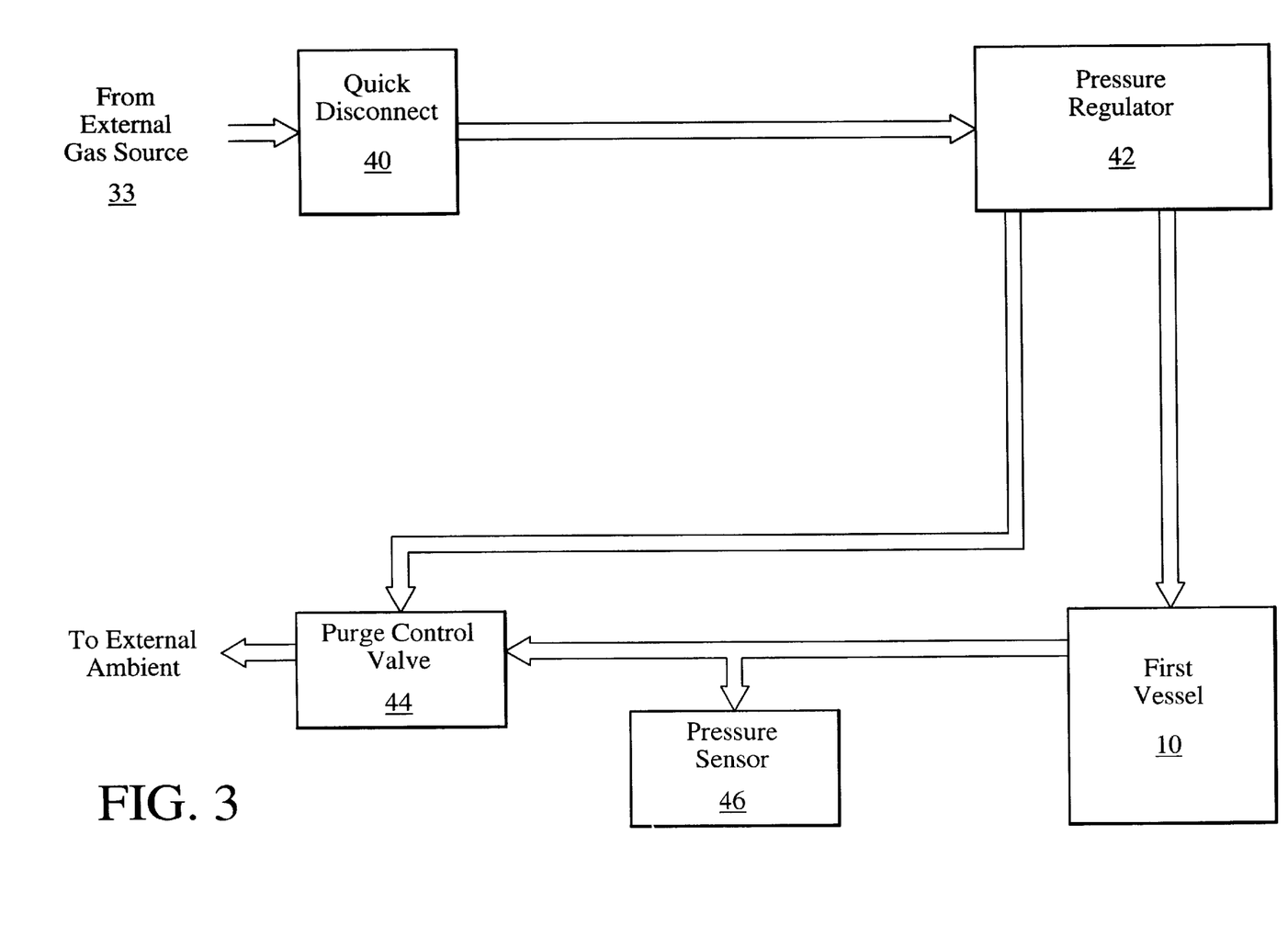
FIG. 3 illustrates a schematic of an ambient control system for the internal vessel shown in FIG. 2, which is in accordance with one embodiment of the present invention.

Shown in FIG. 3 is a schematic of ambient control system 34, which is in accordance with one embodiment of the present invention. In this particular embodiment ambient control system 34 comprises a quick disconnect 40, a pressure regulator 42, a purge control valve 44, and a pressure sensor 46. In one embodiment, purge control valve 44 is a pneumatic valve and pressure sensor 46 is a magnehelic. As shown in FIG. 3, the output of quick disconnect 40 is coupled to the input of pressure regulator 42. The output of pressure regulator 42 is coupled to the interior of first vessel 10, and to the actuation input of purge control valve 44. The interior of first vessel 10 is coupled to the input of pressure sensor 46, and to the flow input of purge control valve 44. The flow output of purge control valve 44 is coupled to the ambient surrounding the exterior of first vessel 10.

During purging, an external gas source 33 is connected to the input of quick disconnect 40, and gas from external gas source 33 passes through quick disconnect 40 to pressure regulator 42, where its pressure is reduced to a pre-determined value. In one embodiment, pressure regulator 42 reduces the gas pressure from approximately 80 psi to 20 psi. Gas from pressure regulator 42 is supplied to the interior of first vessel 10, and to the actuation input of purge control valve 44. This opens purge control valve 44 so that first vessel 10 can be purged. More specifically, it allows gas from external source 33 to pass through first vessel 10 so that contaminates, such as moisture or reactive gases like oxygen, are purged from the interior of first vessel 10. Thus, contaminates that are trapped within first vessel 10 when first vessel 10 is sealed are removed by the purging process. In one embodiment, external gas source 33 supplies nitrogen to the input of quick disconnect 40, and thus nitrogen is injected into the interior of first vessel 10 and a nitrogen blanket is formed around the articles placed within it. Alternatively, external gas source 33 may supply other inert gases, such as argon or helium. During the purging process, pressure sensor 46 monitors the pressure within first vessel 10.

After first vessel 10 has been purged for a pre-determined amount of time, external gas source 33 is disconnected from the input of quick disconnect 40. When this occurs the gas pressure applied to the actuation input of purge control valve 44 begins to drop, and once it falls below a pre-determined value purge control valve 44 closes. It should be appreciated that purge control valve 44 also acts as a pressure relief valve. In particular, the purging process also pressurizes first vessel 10, and if the resulting positive pressure within first vessel 10 is above a pre-determined value after external gas source 33 is disconnected, then purge control valve 44 remains open until the pressure within the interior of first vessel 10 drops below the pre-determined value. In one embodiment, purge control valve 44 remains open if the pressure within first vessel 10 is above approximately 0.045 psi.

Figure 4:
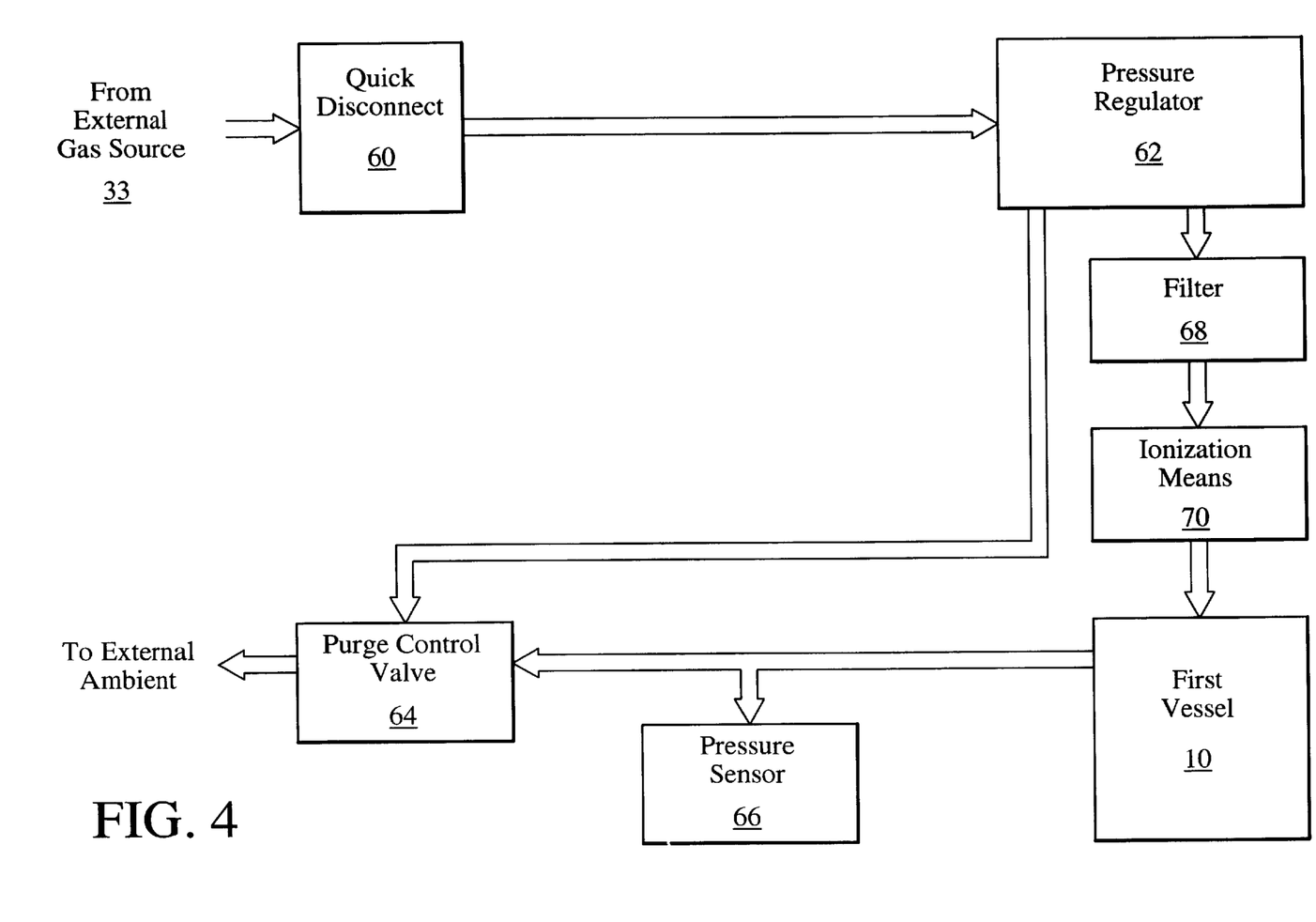
FIG. 4 illustrates a schematic of an ambient control system for the internal vessel shown in FIG. 2, which is in accordance with another embodiment of the present invention.

Shown in FIG. 4 is a schematic of an ambient control system for first vessel 10, which is in accordance with an alternative embodiment of the present invention. In this particular embodiment ambient control system 54 comprises a quick disconnect 60, a pressure regulator 62, a purge control valve 64, a pressure sensor 66, a filter 68, and an ionization means 70. In one embodiment, purge control valve 64 is a pneumatic valve, pressure sensor 66 is a magnehelic, and ionization means 70 is an in line chemical ionizer. In an alternative embodiment, ionization means 70 is an electrical ionizer, which is powered by either a battery located on-board first vessel 10 or by an external power source. As shown in FIG. 3, the output of quick disconnect 60 is coupled to the input of pressure regulator 62. The output of pressure regulator 62 is coupled to the input of filter 68, and to the actuation input of purge control valve 64. The output of filter 68 is coupled to the input of ionization means 70, and the output of ionization means 70 is coupled to the interior of first vessel 10. The interior of first vessel 10 is coupled to the input of pressure sensor 66, and to the flow input of purge control valve 64. The flow output of purge control valve 64 is coupled to the ambient surrounding the exterior of first vessel 10.

In this embodiment, gas from pressure regulator 62 is filtered by filter 68 to remove any particulates and/or unwanted trace gases that may be present within the gas supplied by external gas source 33. After filtration, the gas is ionized by ionization means 70 and the resulting ionized gas is injected into the interior of first vessel 10. The ionized gas dissipates electro-static charge which may be present within the interior of first vessel 10, and thus it provides electro-static discharge protection for articles placed within it.

Figure 5:
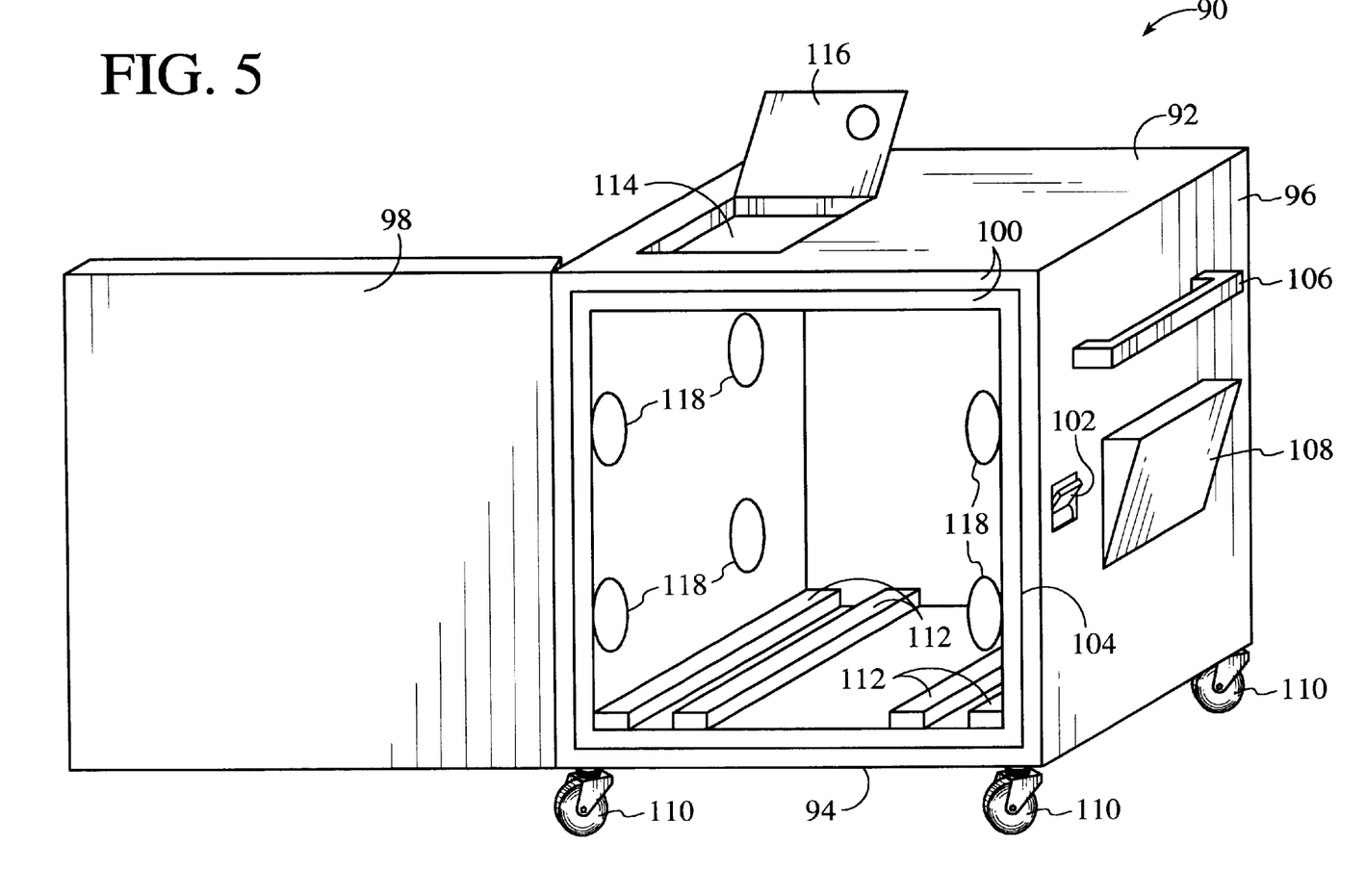
FIG. 5 illustrates an external vessel, which is in accordance with one embodiment of the present invention.

Shown in FIG. 5 is a second vessel 90 in accordance with one embodiment of the present invention. In this particular embodiment second vessel 90 comprises a top 92, a bottom 94, sides 96, a door 98, a door frame 100, a door latch 102, a door seal 104, a push handle 106, a document holder 108, wheels 110, wheel guides 112, an ambient control system 114, and bumpers 118. Ambient control system 114 lies within a recess formed within a portion of top 92 and is accessed through access door 116. Door seal 104 is attached to door frame 100 and is used to form a seal between door 98 and door frame 100. Door latch 102 retains door 98 against door seal 104 when forming the seal between door 98 and door frame 100. In one embodiment, door seal 104 is a gasket made of a halogenated elastomer, such as Viton. Alternatively, door seal 104 may be formed using other materials which are also capable of forming a seal between door 98 and door frame 100, such as a cellular urethane material like Poron. Push handle 106 is mounted to one side 96 of second vessel 90, and it is used to maneuver second vessel 90. In an alternative embodiment, second vessel 90 also comprises a second push handle (not shown), which is mounted to second vessel 90 such that it opposes push handle 106. Document holder 108 is mounted to one side 96 of second vessel 90, and it stores documents accompanying the articles that are placed within first vessel 10. Wheel guides 112 and bumpers 118 are used to align and secure first vessel 10 within second vessel 90. In one embodiment bumpers 118 are made of ultra high molecular weight polyethylene. Alternatively, bumpers 118 may be formed using other materials such as a cellular urethane material like Poron. In one embodiment, top 92, bottom 94, sides 96, door 98, door frame 100, door latch 102, push handle 106, document holder 108, and wheel guides 112 are formed of aluminum in order to minimize the weight of second vessel 90. Alternatively, top 92, bottom 94, sides 96, door 98, door frame 100, door latch 102, push handle 106, document holder 108, and wheel guides 112 may be formed using other materials, such as stainless steel, or combination of materials, such as aluminum and stainless steel.

Figure 6:
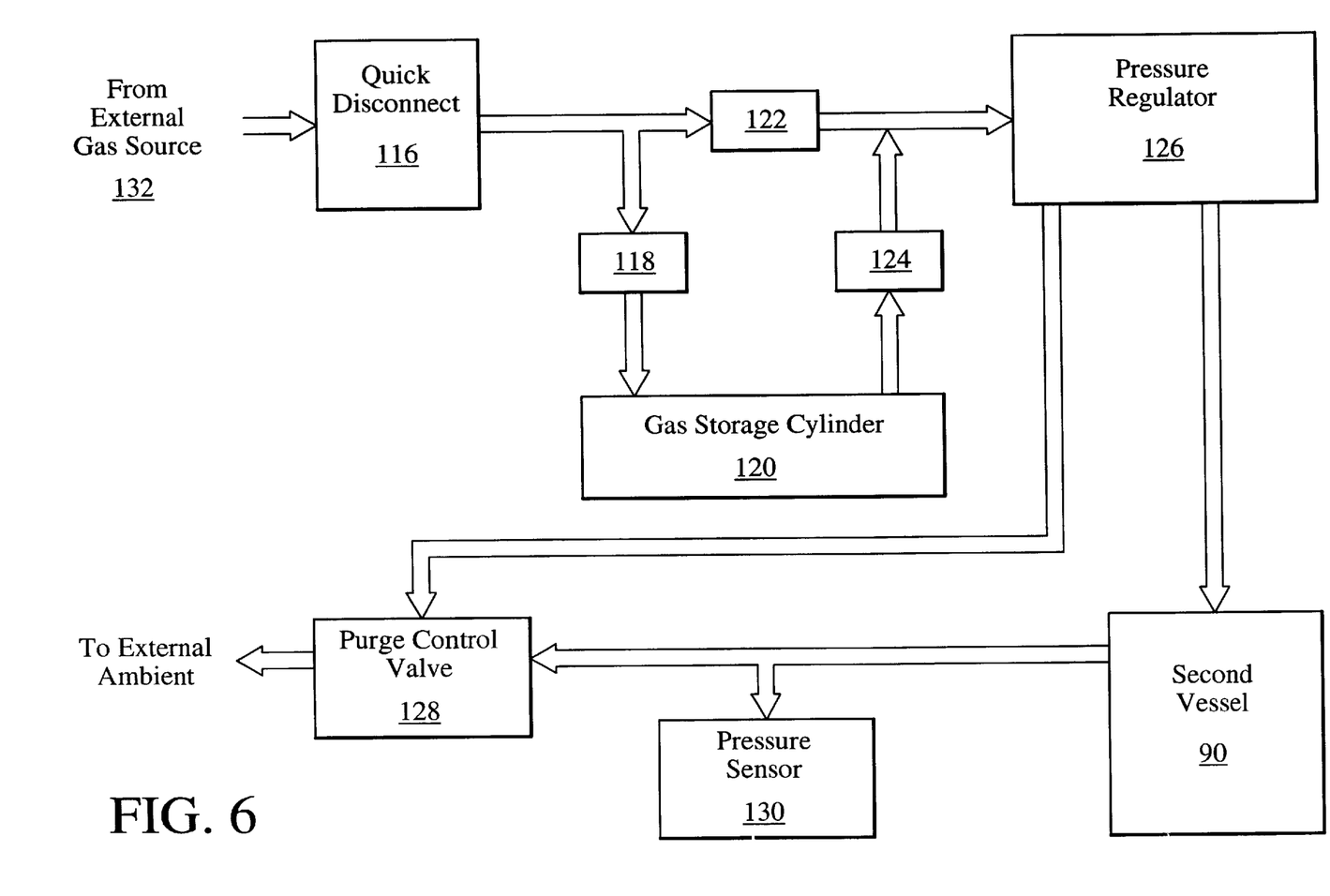
FIG. 6 illustrates a schematic of an ambient control system for the external vessel shown in FIG. 5, which is in accordance with one embodiment of the present invention.

Shown in FIG. 6 is a schematic of ambient control system 114, which is in accordance with one embodiment of the present invention. In this particular embodiment ambient control system 114 comprises a quick disconnect 116, a check valve 118, a gas storage cylinder 120, a check valve 122, a flow restrictor 124, a pressure regulator 126, a purge control valve 128, and a pressure sensor 130. In one embodiment, purge control valve 128 is a pneumatic valve and pressure sensor 130 is a magnehelic. As shown in FIG. 6, the output of quick disconnect 116 is coupled to the input of check valve 118 and to the input of check valve 122. The output of check valve 118 is coupled to the input of storage cylinder 120. The output of storage cylinder 120 is coupled to the input of flow restrictor 124. The output of check valve 122 and the output of flow restrictor 124 are coupled to the input of pressure regulator 126. The output of pressure regulator 126 is coupled to the interior of second vessel 90, and to the actuation input of purge control valve 128. The interior of second vessel 90 is coupled to the input of pressure sensor 130, and to the flow input of purge control valve 128. The flow output of purge control valve 128 is coupled to the ambient surrounding the exterior of second vessel 90.

During purging, an external gas source 132 is connected to the input of quick disconnect 116, and gas from external gas source 132 passes through quick disconnect 116 to pressure regulator 126, where its pressure is reduced to a pre-determined value. In addition, gas passing through quick disconnect 116 also fills storage cylinder 120. In one embodiment pressure regulator 126 reduces the gas pressure from approximately 80 psi to 20 psi. Gas from pressure regulator 126 is supplied to the interior of second vessel 90, and to the actuation input of purge control valve 128. This opens purge control valve 128 so that second vessel 90 can be purged. More specifically, it allows gas from external source 132 to pass through second vessel 90 so that contaminates, such as moisture or reactive gases like oxygen, are purged from the interior of second vessel 90. Thus, contaminates that are trapped within second vessel 90 when second vessel 90 is sealed are removed by the purging process. In one embodiment, external gas source 132 supplies nitrogen to the input of quick disconnect 116, and thus nitrogen is injected into the interior of second vessel 90 and a nitrogen blanket is formed around first vessel 10. Alternatively, external gas source 132 may supply other inert gases, such as argon or helium. During the purging process, pressure sensor 130 monitors the pressure within second vessel 90.

After second vessel 90 has been purged for a pre-determined amount of time, external gas source 132 is disconnected from the input of quick disconnect 116. When this occurs the gas pressure applied to the actuation input of purge control valve 128 begins to drop, and once it falls below a pre-determined value purge control valve 128 closes. It should be appreciated that purge control valve 128 also acts as a pressure relief valve. In particular, the purging process also pressurizes second vessel 90, and if the resulting positive pressure within second vessel 90 is above a pre-determined value after external gas source 132 is disconnected, then purge control valve 128 remains open until the pressure within the interior of second vessel 90 drops below the pre-determined value. In one embodiment, purge control valve 128 remains open if the pressure within second vessel 90 is above approximately 0.045 psi.

After external gas source 132 has been disconnected from quick disconnect 116, a positive pressure is maintained within second vessel 90 by gas supplied by gas storage cylinder 120. Thus, during transit storage cylinder 120 is used to maintain a positive pressure within second vessel 90. Note, flow restrictor 124 prevents purge control valve 128 from being activated by the gas supplied by gas cylinder 120.

It should be appreciated that ambient control system 34 and ambient control system 54 may also be modified to include a gas storage cylinder in a manner similar to that described with respect to FIG. 6.

Figure 7:
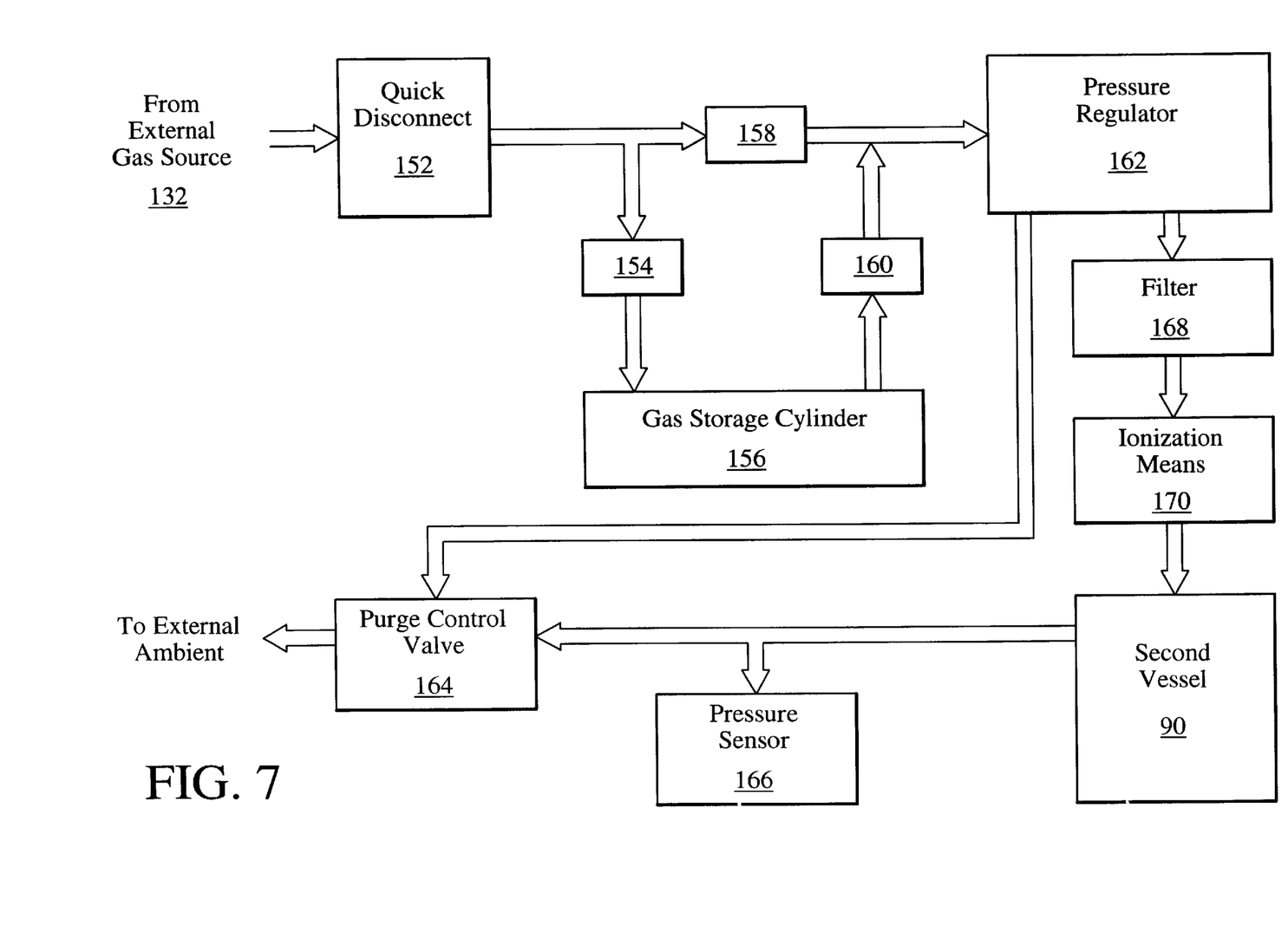
FIG. 7 illustrates a schematic of an ambient control system for the external vessel shown in FIG. 5, which is in accordance with another embodiment of the present invention.

Shown in FIG. 7 is a schematic of an ambient control system 150 for second vessel 90, which is in accordance with an alternative embodiment of the present invention. In this particular embodiment ambient control system 150 comprises a quick disconnect 152, a check valve 154, a gas storage cylinder 156, a check valve 158, a flow restrictor 160, a pressure regulator 162, a purge control valve 164, a pressure sensor 166, a filter 168, and an ionization means 170. In one embodiment, purge control valve 164 is a pneumatic valve, pressure sensor 166 is a magnehelic, and ionization means 170 is an in-line chemical ionizer. In an alternative embodiment, ionization means 170 is an electrical ionizer, which is powered by either a battery located on-board second vessel 90 or by an external power source. As shown in FIG. 7, the output of quick disconnect 152 is coupled to the input of check valve 154 and to the input of check valve 158. The output of check valve 154 is coupled to the input of storage cylinder 156. The output of storage cylinder 156 is coupled to the input of flow restrictor 160. The output of check valve 158 and the output of flow restrictor 160 are coupled to the input of pressure regulator 162. The output of pressure regulator 162 is coupled to the input of filter 168, and to the actuation input of purge control valve 164. The output of filter 168 is coupled to the input of ionization means 170, and the output of ionization means 170 is coupled to the interior of second vessel 90. The interior of second vessel 90 is coupled to the input of pressure sensor 166, and to the flow input of purge control valve 164. The flow output of purge control valve 164 is coupled to the ambient surrounding the exterior of second vessel 90.

In this embodiment, gas from pressure regulator 162 is filtered by filter 168 to remove any particulates and/or unwanted trace gases that may be present within the gas supplied by external gas source 132. After filtration, the gas is ionized by ionization means 170 and the resulting ionized gas is injected into the interior of second vessel 90. The ionized gas dissipates electro-static charge which may be present within the interior of second vessel 90, and thus provides further electro-static discharge protection for articles placed within first vessel 10.

Figure 8:
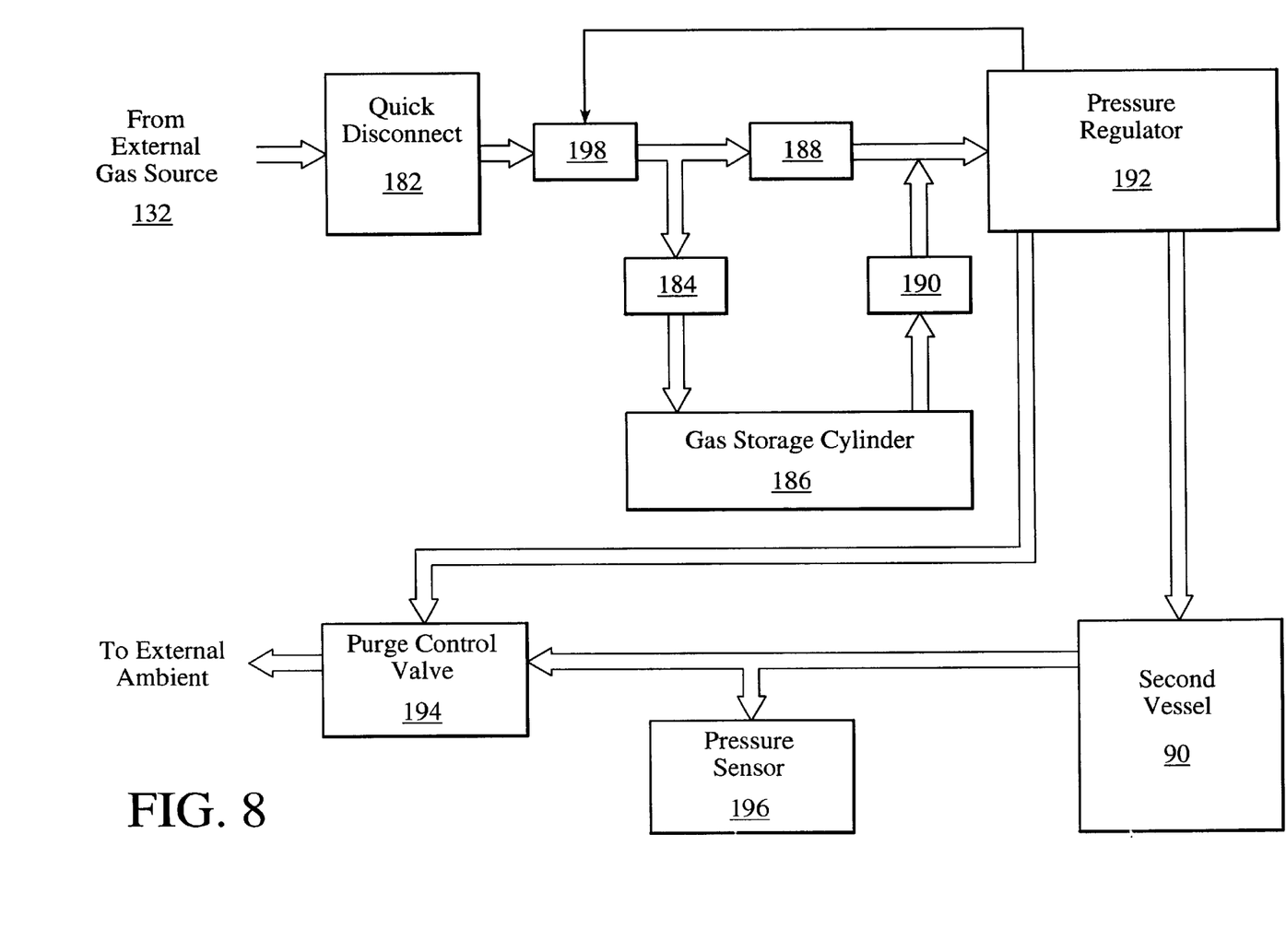
FIG. 8 illustrates a schematic of an ambient control system for the external vessel shown in FIG. 5, which is in accordance with another embodiment of the present invention.

Shown in FIG. 8 is a schematic of an ambient control system 180 for second vessel 90, which is in accordance with an alternative embodiment of the present invention. In this particular embodiment, ambient control system 180 comprises a quick disconnect 182, a check valve 184, a gas storage cylinder 186, a check valve 188, a flow restrictor 190, a pressure regulator 192, a purge control valve 194, a pressure sensor 196, and an inlet control valve 198. In this particular embodiment, inlet control valve 198 is an electronic valve. As shown in FIG. 8, the output of quick disconnect 182 is coupled to the input of valve 198, and the output of inlet control valve 198 is coupled to the input of check valve 184 and to the input of check valve 188. The output of check valve 184 is coupled to the input of storage cylinder 186. The output of storage cylinder 186 is coupled to the input of flow restrictor 190. The output of check valve 188 and the output of flow restrictor 190 are coupled to the input of pressure regulator 192. The output of pressure regulator 192 is coupled to the interior of second vessel 90, and to the actuation input of purge control valve 194. The interior of second vessel 90 is coupled to the input of pressure sensor 196, and to the flow input of purge control valve 194. The flow output of purge control valve 194 is coupled to the ambient surrounding the exterior of second vessel 90. Pressure sensor 196 is electrically coupled to inlet control valve 198. In one embodiment, ambient control system 180 is powered by a battery (not shown) located on-board second vessel 90. In an alternative embodiment, ambient control system 180 is powered by an external power source.

In this embodiment, pressure sensor 196 monitors the pressure within second vessel 90, and when a pre-determined pressure is sensed pressure sensor 196 sends a signal to inlet control valve 198 which causes inlet control valve 198 to close. When this occurs the gas pressure applied to the actuation input of purge control valve 194 begins to drop, and once it falls below a pre-determined value purge control valve 194 closes. In one embodiment, purge control valve 194 remains open if the pressure within second vessel 90 is above approximately 0.045 psi.

After external gas source 132 has been disconnected from quick disconnect 182, pressure within second vessel 90 is maintained by gas supplied by gas storage cylinder 186. Thus, during transit storage cylinder 186 pressurizes or purges second vessel 90. Note, flow restrictor 190 prevents purge control valve 194 from being activated by the gas supplied by gas storage cylinder 186.

It should be appreciated that ambient control system 180 may also be modified to include a filter and an ionization means in a manner similar to that described with respect to FIG. 7. In addition, it should also be appreciated that ambient control system 34 and ambient control system 54 may also be modified to include an electronic valve which is responsive to a pressure sensor in a manner similar to that described with respect to FIG. 8.

A method for transporting an article placed within cart 5 will now be described in greater detail. It should be understood that the present invention is applicable to the manufacture of a variety of articles, such integrated circuits, computer hard disks, liquid crystal displays (LCD), flat panel displays, imaging devices (e.g. charge coupled devices (CCD), thermal imaging devices), infra red sensors or other types of sensors, aerospace components, subassemblies, and systems, optical implements and devices (e.g. detraction gratings, lenses), and other photolithography-produced articles. In one embodiment, an integrated circuit substrate is placed within vessel 10 and the door 18 of first vessel 10 is closed and sealed against door seal 24. First vessel 10 is then purged with an inert gas supplied by external gas source 33. In one embodiment, external gas source 33 supplies nitrogen to quick disconnect 52, and thus nitrogen is injected into the interior of first vessel 10 in order to purge first vessel 10. After first vessel 10 has been purged for a pre-determined amount of time, purge control valve 44 is closed. External gas source 33 is then disconnected from first vessel 10 and first vessel 10 is then loaded into second vessel 90. It should be appreciated that first vessel 10 may be placed within second vessel 90 using a ramp or a lifting mechanism, such as an elevator. After first vessel 10 has been loaded within second vessel 90, the door 102 of second vessel 90 is closed and sealed against door seal 104. Second vessel 90 is then purged with an inert gas supplied by external gas source 132. In one embodiment, external gas source 132 supplies nitrogen to quick disconnect 116, and thus nitrogen is injected into the interior of second vessel 90 in order to purge second vessel 90. After second vessel 90 has been purged for a pre-determined amount of time, the purge control valve 128 is closed. External gas source 132 is then disconnected from second vessel 90. Cart 5 which contains the integrated circuit substrate is then transported to the next manufacturing area. During transit storage cylinder 120 maintains a positive pressure within second vessel 90.

When cart 5 arrives at the next manufacturing area, second vessel 90 is opened and first vessel 10 is then removed from second vessel 90. Once again first vessel 10 may be removed from second vessel 90 using a ramp or lifting mechanism, such as an elevator. After removal, first vessel 10 is then opened and the integrated circuit substrate placed within first vessel 10 is then removed and it undergoes further processing.

Thus it is apparent that there has been provided, in accordance with the present invention, an apparatus and a method for transporting and storing articles which are vulnerable to contamination and electro-static discharges, particularly as applied to a manufacturing process for such articles. As an example, such an apparatus and method may be used to transport and store articles prior to delivery to a manufacturing station at which a manufacturing process is conducted on the article. As another example, such an apparatus and method may be used to transport and store articles from one manufacturing station to another manufacturing station, thereby enabling manufacturing operations to be conducted on the article at manufacturing stations (which may include manufacturing stations, testing stations, packaging stations, etc.) that may be geographically remote from each other, all while preventing contamination and electrostatic discharge type damage to the articles. In accordance with the present invention, distributed manufacturing environments may be more readily obtained, which in certain situations present significant cost or other advantages. Such manufacturing methods are enabled in accordance with preferred embodiments of the present invention.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What is claimed is:

1. A cart for transporting an article in a manufacturing environment, comprising:
    a first vessel, the first vessel having a first seal for sealing a door of the first vessel, and a first ambient control system for purging the first vessel with a first gas, the first ambient control system comprising a purge control valve for controlling flow of the first gas through the first vessel; and
    a second vessel enclosing the first vessel, the second vessel having a second seal for sealing a door of the second vessel, and a second ambient control system for purging the second vessel with a second gas, the second ambient control system comprising a purge control valve for controlling flow of the second gas through the second vessel.

2. The cart of claim 1, wherein the second vessel is further characterized as having a means for aligning the first vessel within the second vessel.

3. The cart of claim 2, wherein the means for aligning the first vessel comprises a wheel guide.

4. The cart of claim 1, wherein the second ambient control system comprises a gas cylinder mounted to the second vessel for maintaining a pressure within the second vessel.

5. The cart of claim 1, wherein the second ambient control system further comprises a filter for filtering the second gas.

6. The cart of claim 1, wherein the second ambient control system further comprises an ionization means for ionizing the second gas.

7. The cart of claim 1, wherein the second ambient control system further comprises a pressure sensor for sensing a pressure within the second vessel.

8. The cart of claim 1, wherein the first ambient control system further comprises a filter for filtering the first gas.

9. The cart of claim 1, wherein the first ambient control system further comprises an ionization means for ionizing the first gas.

10. The cart of claim 1, wherein the first ambient control system further comprises a pressure sensor for sensing a pressure within the first vessel.

11. The cart of claim 1, wherein the first ambient control system further comprises a pressure regulator coupled to the purge control valve, wherein gas coming from the pressure regulator actuates the purge control valve.

12. The cart of claim 1, wherein the second ambient control system further comprises a pressure regulator coupled to the purge control valve, wherein gas coming from the pressure regulator actuates the purge control valve.

13. The cart of claim 1, wherein the first ambient control system further comprises a pressure sensor and an inlet control valve for controlling flow of the first gas, wherein in response to the pressure sensor sensing a pre-determined pressure within the first vessel the pressure sensor causes the inlet control valve to close.

14. The cart of claim 1, wherein the second ambient control system further comprises a pressure sensor and an inlet control valve for controlling flow of the second gas, wherein in response to the pressure sensor sensing a pre-determined pressure within the first vessel the pressure sensor causes the inlet control valve to close.

15. The cart of claim 1, wherein the first vessel is further characterized as having wheels.

16. The cart of claim 1, wherein the second vessel is further characterized as having wheels.

17. The cart of claim 1, wherein the first seal is further characterized as a first gasket.

18. The cart of claim 1, wherein the second seal is further characterized as a second gasket.

19. A method of transporting an article in a manufacturing environment, comprising the steps of:
    providing a first vessel, the first vessel having a first seal and a door;
    placing an article within the first vessel;
    sealing the door of the first vessel against the seal of the first vessel;
    purging the first vessel with a first gas;
    providing a second vessel, the second vessel having a second seal and a door;
    placing the first vessel within the second vessel;
    sealing the door of the second vessel against the seal of the second vessel;
    purging the second vessel with a second gas; and
    transporting the article via the first vessel and the second vessel.

20. The method of claim 19, wherein the step of purging the first vessel with the first gas is further characterized as purging the first vessel with an inert gas.

21. The method of claim 19, wherein the step of purging the first vessel with the first gas is further characterized as purging the first vessel with nitrogen.

22. The method of claim 19, wherein the step of purging the first vessel with the first gas is further characterized as purging the first vessel with ionized nitrogen.

23. The method of claim 19, further comprising the step of pressurizing the first vessel with the first gas.

24. The method of claim 19, wherein the step of purging the second vessel with the second gas is further characterized as purging the second vessel with an inert gas.

25. The method of claim 19, wherein the step of purging the second vessel with the second gas is further characterized as purging the second vessel with nitrogen.

26. The method of claim 19, wherein the step of purging the second vessel with the second gas is further characterized as purging the second vessel with ionized nitrogen.

27. The method of claim 19, further comprising the step of pressurizing the second vessel with the second gas.

28. The method of claim 19, wherein the step of placing the article within the first vessel is further characterized as placing an integrated circuit substrate within the first vessel.

29. The method of claim 19, wherein the step of placing the article within the first vessel is further characterized as placing a substrate for a disk drive within the first vessel.

30. The method of claim 19, wherein the step of placing the article within the first vessel is further characterized as placing a packaged integrated circuit within the first vessel.

31. The method of claim 19, wherein the first seal is further characterized as a first gasket.

32. The method of claim 19, wherein the second seal is further characterized as a second gasket.

33. A method, comprising the steps of:
    providing a first vessel, the first vessel having a first seal and a door at a first location;

placing an article to be processed within the first vessel;

sealing the door of the first vessel against the seal of the first vessel;

purging the first vessel with a first gas;

providing a second vessel, the second vessel having a second seal and a door;

placing the first vessel within the second vessel;

sealing the door of the second vessel against the seal of the second vessel;

purging the second vessel with a second gas;

transporting the article via the first vessel and the second vessel to a second location; and conducting a manufacturing process on the article.

34. The method of claim 33, wherein the step of purging the first vessel with the first gas is further characterized as purging the first vessel with an inert gas.

35. The method of claim 33, wherein the step of purging the first vessel with the first gas is further characterized as purging the first vessel with nitrogen.

36. The method of claim 33, wherein the step of purging the first vessel with the first gas is further characterized as purging the first vessel with ionized nitrogen.

37. The method of claim 33, further comprising the step of pressurizing the first vessel with the first gas.

38. The method of claim 33, wherein the step of purging the second vessel with the second gas is further characterized as purging the second vessel with an inert gas.

39. The method of claim 33, wherein the step of purging the second vessel with the second gas is further characterized as purging the second vessel with nitrogen.

40. The method of claim 33, where in the step of purging the second vessel with the second gas is further characterized as purging the second vessel with ionized nitrogen.

41. The method of claim 33, further comprising the step of pressurizing the second vessel with the second gas.

42. The method of claim 33, wherein the step of placing the article within the first vessel is further characterized as placing an integrated circuit substrate within the first vessel.

43. The method of claim 33, wherein the step of placing the article within the first vessel is further characterized as placing a substrate for a disk drive within the first vessel.

44. The method of claim 33, wherein the step of placing the article within the first vessel is further characterized as placing a packaged integrated circuit within the first vessel.

45. The method of claim 33, wherein the first seal is further characterized as a first gasket.

46. The method of claim 33, wherein the second seal is further characterized as a second gasket.

47. The method of claim 33, wherein the article is selected from the group consisting of an integrated circuit, computer hard disk, liquid crystal display, flat panel displays, imaging device, sensor, aerospace component, and optical implement.

48. The method of claim 33, wherein the steps are repeated a plurality of times, wherein the article is manufactured, wherein the manufacturing is conducted at two or more geographically remote locations.

* * * * *